(12) United States Patent
Numata

(10) Patent No.: US 6,404,664 B1
(45) Date of Patent: Jun. 11, 2002

(54) TWISTED BIT LINE STRUCTURE AND METHOD FOR MAKING SAME

(75) Inventor: Ken Numata, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/405,738

(22) Filed: Sep. 24, 1999

Related U.S. Application Data

(60) Provisional application No. 60/102,370, filed on Sep. 29, 1998.

(51) Int. Cl.[7] ................................................. G11C 5/08
(52) U.S. Cl. ........................................ 365/69; 365/163
(58) Field of Search ................................ 365/136, 138, 365/164, 63, 69

(56) References Cited

U.S. PATENT DOCUMENTS 6,069,815 A * 5/2000 Mueller et al. ............... 365/63

* cited by examiner

Primary Examiner—David Nelms
Assistant Examiner—Thong Le
(74) Attorney, Agent, or Firm—Michael K. Skrehot; W. James Brady, III; Frederick J. Telecky, Jr.

(57) ABSTRACT

A twisted bit line structure (89) in an integrated memory circuit, and method for making it are presented. The structure is constructed by forming bit line traces (90, 92, 94, 96) on an integrated circuit substrate (88) using phase shift lithography techniques. Using these techniques, the bit line traces are arranged with a plurality of substantially parallel bit lines trace segments (90, 92, 94, 94', 96, 96') with discontinuous regions between segments of the interior pair (94, 94'; 96, 96') of traces. Thus, each "phase π" bit line trace is adjacent a "phase 0" bit line trace. A first twist connection (102) is formed between first segments (96, 94') of the center pair of said bit line trace segments at a first height above the level on which the traces are formed, and, and a second twist connection (100) is formed between second segments (94, 96') of the center pair of said bit line trace segments at a second height above the level on which the traces are formed.

13 Claims, 5 Drawing Sheets

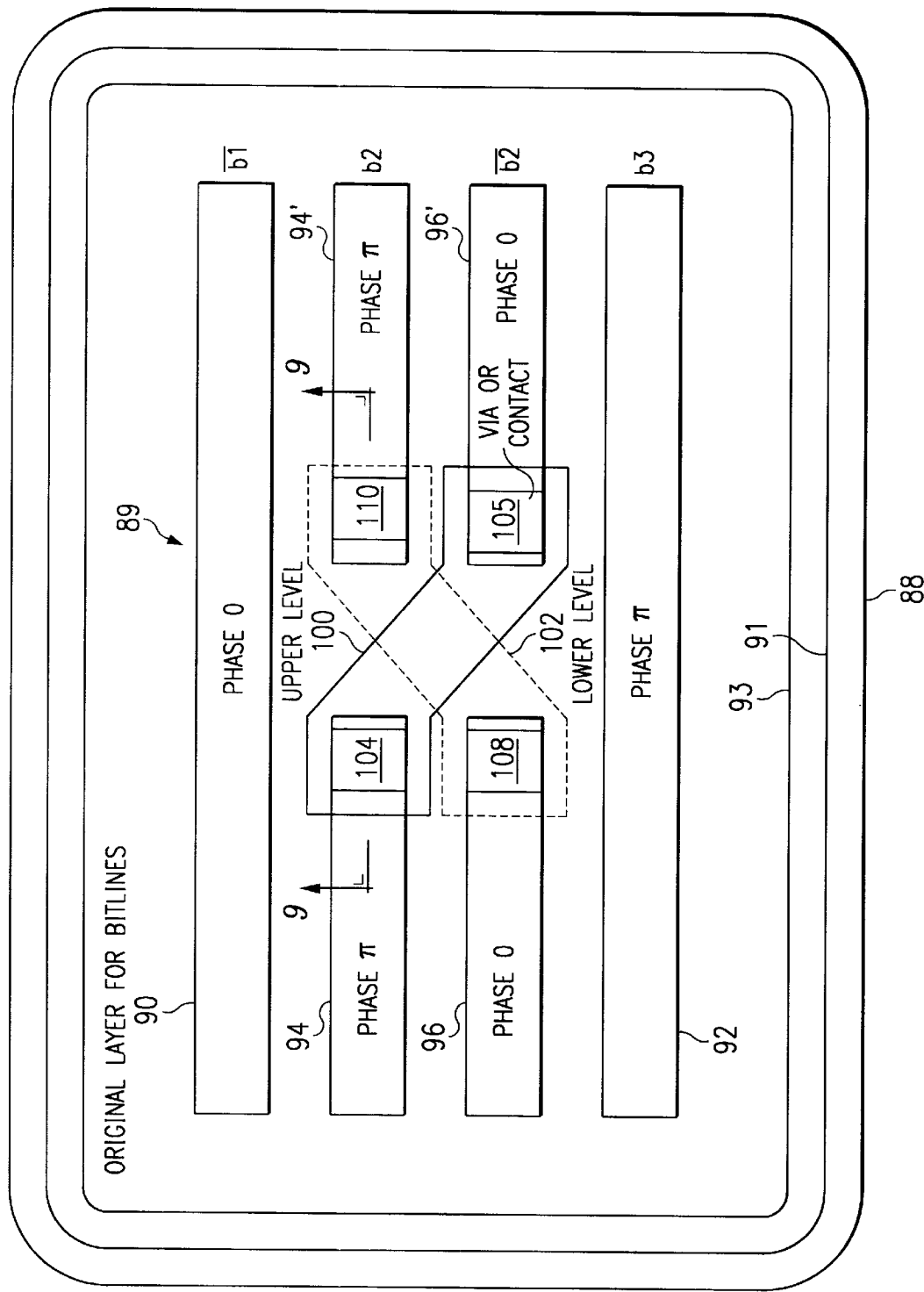

TWISTED BIT LINE STRUCTURE AND METHOD FOR MAKING SAME

This application claims priority under 35 USC §119(e)(1) of provisional application No. 60/102,370 filed Sep. 29, 1998.

BACKGROUND OF THE INVENTION

1. Field of the Invention

This invention pertains to improvements in memory cell array layouts and designs, and more particularly to improvements in memory cell bit line structures, and still more particularly to improvements in twisted bit line structures and methods for making same.

2. Relevant Background

An electrical schematic diagram of a portion 10 of a memory array in which the bit line structure and method for making it in which the invention may be practiced is shown in FIG. 1. As is well known, the memory array includes a number of word lines w1 . . . w6, and complementary bit line pairs b1, b2, b2, b3, and so on.

Sensing amplifiers 12, 12', 12", . . . are provided in association with each bit line pair. As is known, when noise, denoted by the arrows 14—14 appears across a pair of bit of lines, such as bit lines b2 and b2, the noise may be conducted to the sensing amplifier 12', and may erroneously be interpreted as data, lack of data, or undesirably modified data.

It is well known that by twisting bit line structures in integrated circuits, such as memory cells, or the like, noise that may be induced into the bit line structure can be effectively canceled. Various bit line layouts are shown in FIG. 2. For example, in FIG. 2a, a bit line arrangement is shown in which no twist exists within the bit line pairs. This is similar to the bit line arrangement of the memory array of FIG. 1. In FIG. 2b, a bit line arrangement is shown in which the twist is provided in a bit line pair located between two untwisted bit line pairs. This twist arrangement results in significantly better noise cancellation than the untwisted layout of FIG. 2a, but does not provide perfect noise cancellation. In FIG. 2c, a bit line arrangement is shown in which the twist is provided in each bit line pair, with the twist arranged in a staggered relationship with respect to each other. This bit line arrangement provides the best noise cancellation of the three examples shown in FIG. 2.

More particularly, the physical layout of a typical bit line twist structure is shown in FIG. 3. As shown, bit line b1 and b3 are continuous, but complementary bit lines b2 and b2 are interconnected with a twist structure 18. In order to accomplish the twist, bit lines b2 and b2 are made discontinuous so that the respective ends of the bit line b2 and bit line b2 can be interconnected.

Thus, a diagonal conducting trace 20 is provided between bit line b2 on the right and bit line b2 on the left in a continuous pattern. All of the bit lines and the diagonal interconnect 20 are formed on a single level, for example, on a dielectric layer of an underlying substrate (not shown). In order to connect the left side of bit line b2 to the right side of bit line b2, an upper or lower level diagonal interconnect 22 is employed. The interconnect 22 is connected to the associated bit line segments of b2 and b2 through vias 24 and 26, and is formed in a vertical location separated from the bit line segments by a dielectric layer (not shown). Typically the interconnect 22 is formed above the level of the bit line traces, but, as mentioned, can be formed at a lower level.

Thus, conventionally, bit line structures are laid out on a semiconductor substrate by a number of parallel conductive traces. At pre-determined locations, the traces are formed in a discontinuous manner, with a diagonal interconnection made between the first set of the conductive traces and, on a different integrated circuit level, with a second diagonal interconnection between the second trace portions, with connections made to the traces by vias or other inter-level interconnections.

Thus, in the past, bit line construction has been accomplished by depositing a number of the conductive traces onto a semiconductor substrate, with spaced apart diagonal conductors formed between selected adjacent bit lines and with discontinuities in the respective lines that will subsequently be interconnected. After an insulating layer has been formed over the bit line structure, vias are formed through the insulating layer to the surfaces of the discontinuous bit lines. Thereafter, a diagonal conductor segment is formed to interconnect the discontinuous bit lines through the vias. Of course, the vertical order and placement of the diagonal interconnection may be varied, with the diagonal interconnection being first formed and the bit line structure being formed over an insulating layer in which are properly located vias may have been formed.

Thus, in order to construct twisted bit lines, a first bit line is typically constructed at an original level, and portions or segments of a second bitline are constructed parallel to the first bit line. However, in order for the second and bit line to be constructed without shorting to the first as it crosses thereover, an interconnection must be provided that is insulated from the first bit line. Such interconnection is generally constructed to be located either over or under the first and separated therefrom by a suitable insulation layer; typically, the interconnections of the second bit line are located at an upper level that is separated and insulated from the first bit line.

It should be noted that in the past, in the formation of the bitlines, a reticle has been used in which a number of opaque parallel line segments are formed on a glass substrate. The opaque parallel line segments may be formed, for example, of chromium or other material on the glass or other transparent substrate. The reticle is placed on or adjacent a surface of a substrate on which a photosensitive material has been deposited. Light is passed through the reticle, and is masked by the opaque line segments formed thereon but allowed to pass by the adjacent transparent line segments, to expose unmasked portions of the photosensitive material to the light. This causes a chemical change in the material that allows selected portions (for example, the light exposed portions) of the material to be removed.

However, since the typical scales patterned on wafers are comparable to the wave length of the light used in lithography equipment, the resulting pattern on the photosensitive material on the substrate therefore may have blurred or fuzzy edge definitions. When the photo sensitive material is removed during subsequent processing steps, the blurred or fuzzy edge definition may result in an inaccurate patterning, which, in turn, may result in unintended contact between adjacent memory array structures, such as the bit lines of concern herein.

To address this problem, a so-called "Levenson" reticle has been proposed in which selected portions of the glass substrate between masked elements are etched. The etched regions are, referred to as "π" regions, or "phases," and the unetched regions are referred to as "0" regions, or "phases". By careful selection of the "π" and "0" regions, a pattern can be produced onto a semiconductor device having known semiconductor processing layers thereon which have sharply defined edges. Since the etched portions of the reticle are lower than the unetched portions, light passing through the reticle has a smaller light path, and therefore causing interference patterns, on the photo resist or substrate being patterned. This results in significantly better integrated circuit structure formation. In fact, it has been estimated that a Levenson reticle can produce line patterns with approximately twice the resolution of that of a conventional reticle.

The process by which the bit lines are formed includes the exposure of a photo sensitive layer (not shown) that has been deposited or formed onto the surface of the substrate on which the bit lines are to be constructed. In the past, a reticle mask 30 has been provided, as shown in FIG. 4a. The reticle mask includes a number of mask elements 32 formed on a surface 30 of a glass substrate 36. The mask elements 32 may be, for example, metal, such as chromium or the like. Typical scales on wafers are comparable to the wave length of the light used in lithography equipment. As a result, light that passes through the inter-spaces between the mask elements 32 produces interference patterns on the photo sensitive substrate when it is exposed. A typical pattern from a conventional reticle mask is shown in FIG. 4b. This results in imprecise line patterns, which can lead to shorting between adjacent bit line structures, especially as feature sizes in integrated circuit devices becomes smaller and smaller.

SUMMARY OF THE INVENTION

In light of the above, it is, therefore, an object of the invention to provide an improved method for making an improved twisted bit line.

It is another object of the invention to provide a method for constructing twisted bit lines using a "Levenson" mask, in which bit line diagonal connections can be made between bit line structures according to the Levenson phase shift layout rules.

It is yet another object of the invention to provide an improved bit line structure.

It is still another object of the invention to provide an improved bit line structure of the type described that may be more reliably constructed to avoid inadvertent shorts or contacts to adjoining integrated circuit structures.

These and other objects, features and advantages of the invention will be apparent to those skilled in the art from the following detailed description of the invention, when read in conjunction with the accompanying drawings and appended claims.

Thus, according tot present invention, a method is presented for making twisted bit line structures in an integrated circuit, such as an integrated circuit memory chip, or the like, using two Levenson phase shift rules: 1) structures with different phase must not touch; 2) and geometries, separated by the minimum design rule for the integrated circuit under consideration, should be constructed with different phases, Following these rules, thereover, and in accordance with a preferred embodiment of the present invention, a method is presented for interconnecting selected bit lines to accomplish a twisted bit line structure, by providing an interconnection between bit line segments that are untwisted in locations adjacent to locations at which the twist is provided in an adjacent bit line pair. Thus, if a series of bit line traces are formed with alternate "π" and "0" phases, interconnections can be made at upper or lower integrated circuit structural levels of both the twisted and untwisted bit line traces, to accomplish the twisted bit line structure.

In accordance with a broad aspect of the invention, therefore, a method for constructing a twisted bit line structure in an integrated memory circuit is presented. The method includes forming bit line traces on an integrated circuit substrate using phase shift lithography techniques. Using these techniques, the bit line traces are arranged with a plurality of substantially parallel bit line trace segments with discontinuous regions between segments of an interior pair of traces, with each "phase π" bit line trace being adjacent a "phase 0" bit line trace along two perpendicular axes. Twist connections are formed between first and second segments of a center pair of said bit line trace segments with each interconnection being formed at a different level from a level at which the bit line traces are formed.

According to another broad aspect of the invention, a twisted bit line structure for an integrated memory circuit is presented. The structure includes a plurality of bit line trace segments. At least a pair of the untwisted bit line trace segments are located adjacent and substantially parallel to an adjacent twisted bit line pair of bit line trace segments. Interconnections are established between discontinuous portions of the bit lines segments of the twisted bit line segments, the interconnection being contained on different levels from a level on which the bit line segments are contained.

BRIEF DESCRIPTION OF THE DRAWINGS

The invention is illustrated in the accompanying drawing, wherein:

FIG. 8 is a diagram showing a bit line layout in which lines of different phases are interconnected, in accordance with a preferred embodiment of the invention.

In the various drawings, like reference numerals are used to denote like or similar parts. Additionally, the drawings are not necessarily drawn to scale.

DETAILED DESCRIPTION OF THE PREFERRED EMBODIMENTS

Figure 6A:
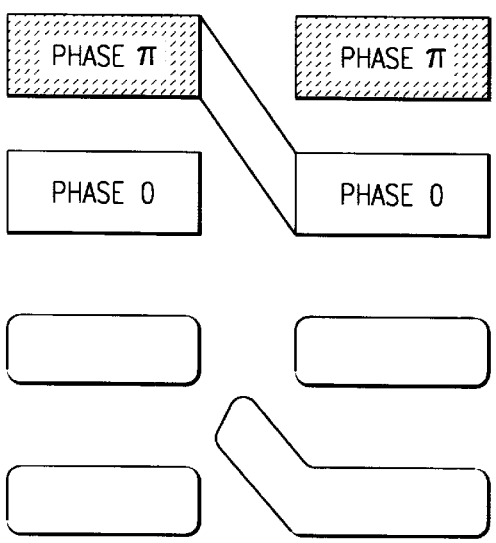
FIGS. 6a and b show the results of "Levenson" phase shift rules, wherein respectively the geometries with different phases are intended to touch, and the geometries with the same phase are adjacent each other.
Figure 6B:
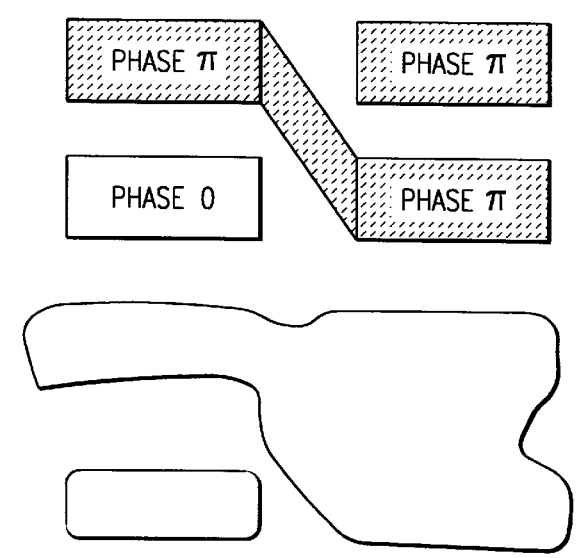

As mentioned, the bit lines formed in accordance with the invention are made according to two Levenson phase shift rules. The first rule is that structures with different phase must not touch. The second rule is that geometries, separated by the minimum design rule for the integrated circuit under consideration, should be constructed with different phases. The origin of the rules can be appreciated from the diagram shown in FIG. 6. Thus, two possible effects of using a Levenson phase shift reticle are shown. In FIG. 6a, it can be seen that a desired interconnection between "phase π" and "phase 0" regions may result in a disconnect due to the imprecision in light masking, described above. It is noted that the features between opposite phases are crisp and sharp. By the same token, with reference to FIG. 6b, if two phases some of the same type, for example, "phase π" were to be adjacent, the light interference may well cause a pattern that produces imprecise pattern differentiating regions, resulting in the conductor material of the adjacent bit lines to short from one bit line to an adjacent bit line, as shown.

Figure 5A:
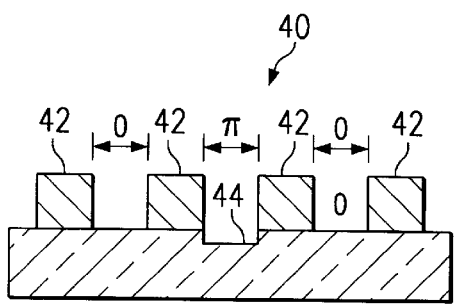
FIGS. 5a and b show respectively a side view "Levenson" phase shift reticle used in the construction of bit lines that may be used in a semiconductor memory device, and the exposure pattern formed thereby in accordance with a preferred embodiment of the invention.

As is known, a "Levenson" phase shift reticle includes regions on which opaque material 42 has been deposited to form a mask having alternating opaque and transparent regions. In addition, the Levenson reticle has regions of the transparent areas that have been etched, such as region 44, by a sufficient amount to effect a phase shift in the light passing through the reticle to reduce fuzzy edges between traces formed by different phases in the resulting pattern imprinted on a photoresist layer corresponding to the pattern of the mask. The etched regions of the Levenson mask are generally referred to as "phase π" regions, and the unetched transparent regions are generally referred to as "phase 0" regions. Similarly, the bit line traces that are formed through the use of the Levenson reticle are referred to as "phase π" traces or "phase 0" traces, depending upon whether they were patterned by a "phase π" mask region or a "phase 0" mask region. Thus, a "Levenson" phase shift reticle of the type illustrated in FIG. 5a can be used in the following manner.

Figure 1:
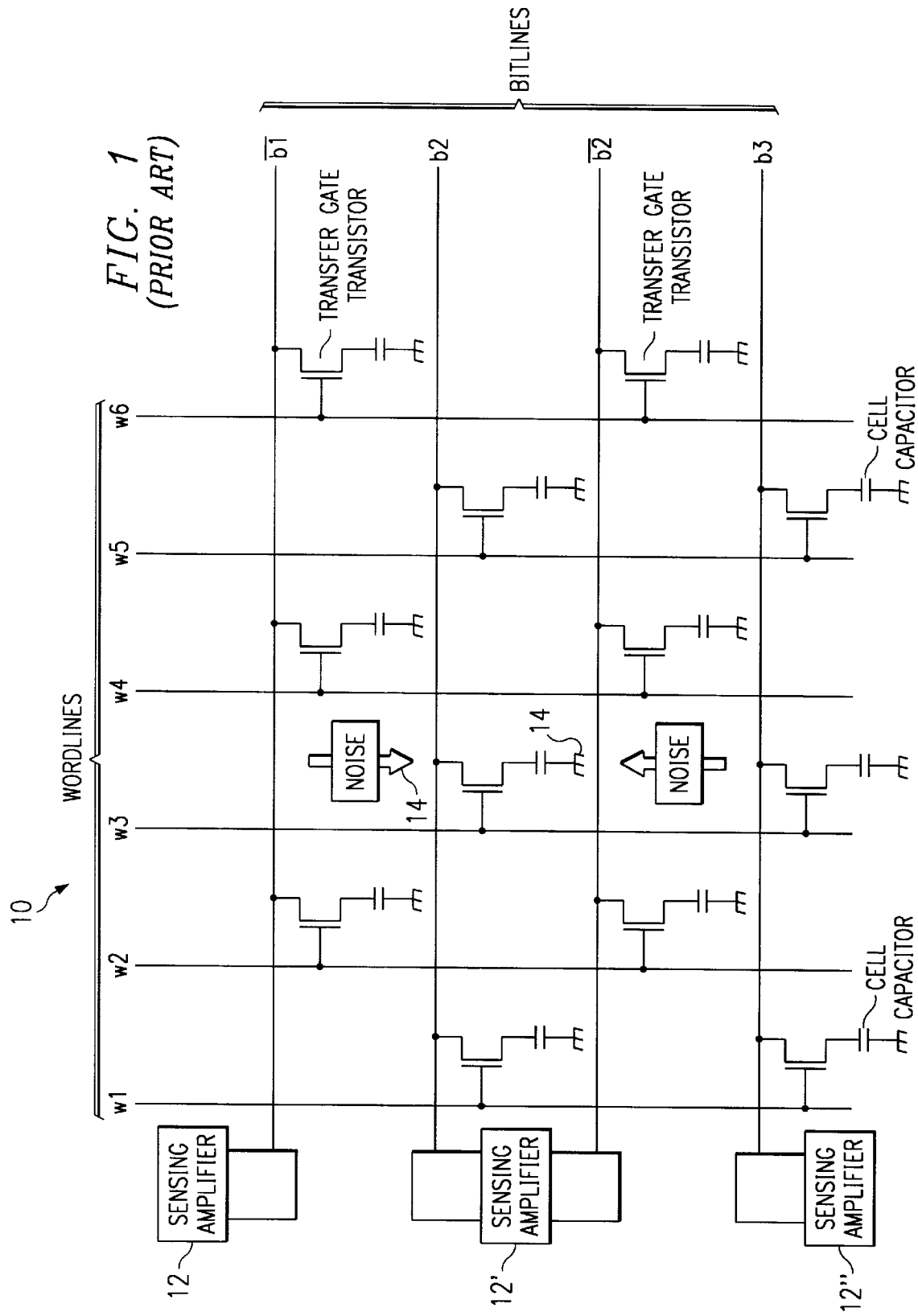
FIG. 1 is an electrical schematic diagram of a portion of a semiconductor integrated circuit memory, according to the prior art, in which a twisted bit line according to the invention may be used.
Figure 2A:
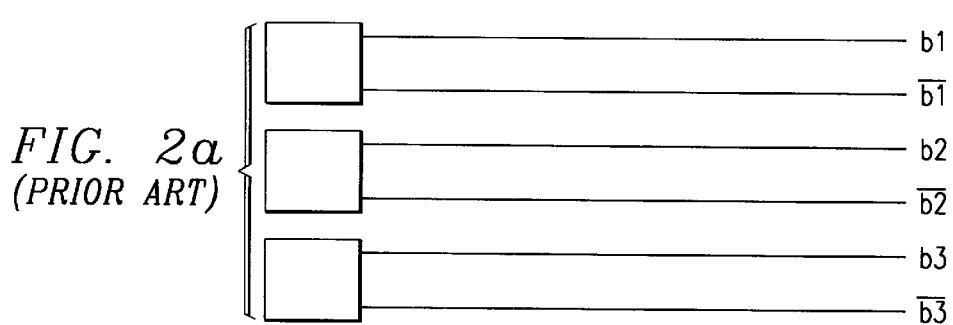
FIGS. 2a, b, and c are representations of typical layout schemes for memory circuit construction that have, respectively, no twist, twist for each other pair, and twist for each pair.
Figure 2B:
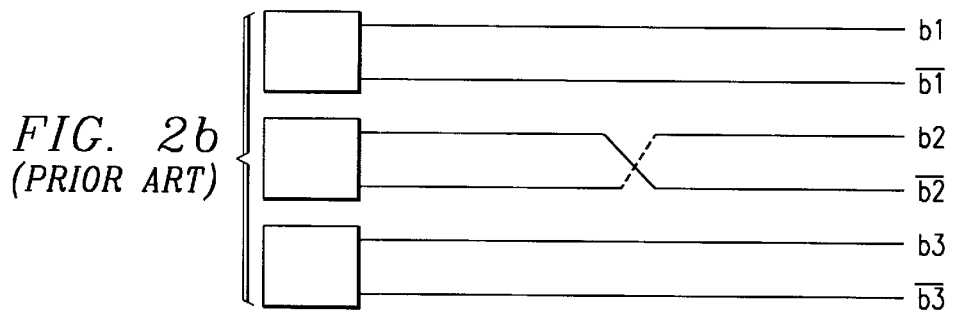
Figure 2C:
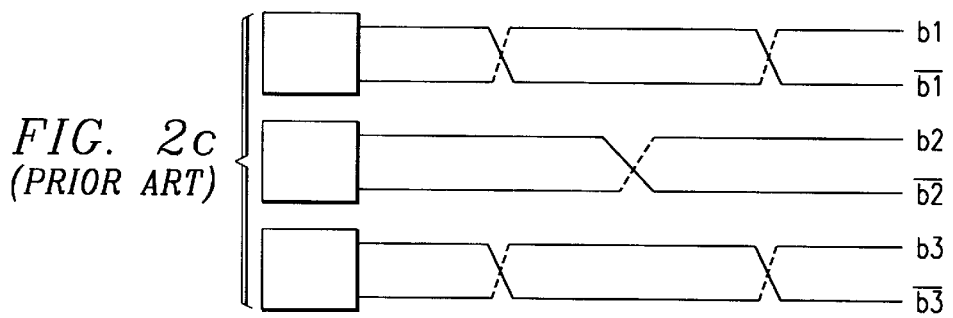
Figure 3:
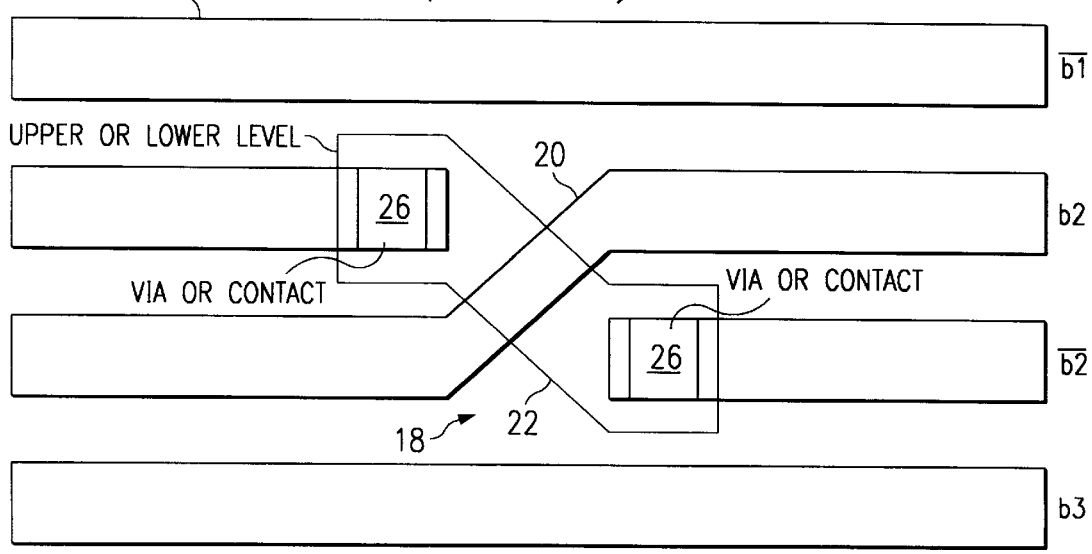
FIG. 3 is a diagram showing a bit line twist layout, in accordance with the prior art.
Figure 4A:
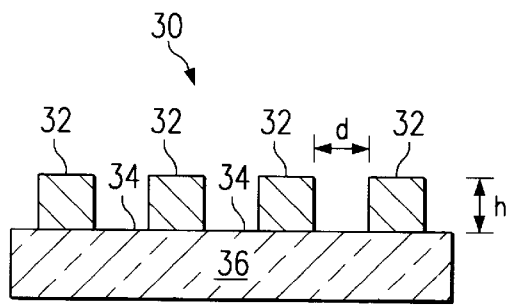
FIGS. 4a and b show respectively a side view of a conventional reticle used in a the construction of bit lines that may be used in a semiconductor memory device, and the exposure pattern formed thereby in accordance with the prior art.
Figure 4B:
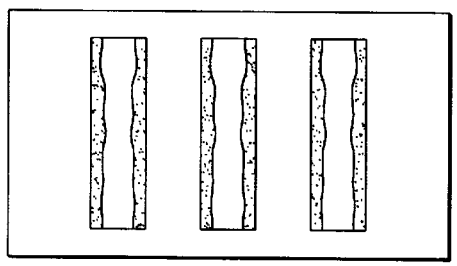
Figure 5B:
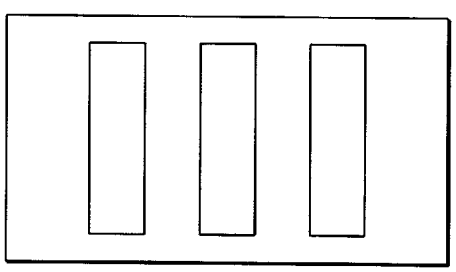

The Levenson reticle 40 is used to mask light impingent thereupon to allow selected portions of the light to pass through the transparent regions to expose an underlying photosensitive layer on the substrate on which an integrated circuit is intended to been built. By careful construction of the Levenson reticle, the pattern that is imprinted into the photosensitive material may be generally as shown in FIG. 5b. It should be noted that the edges of the exposed regions are relatively sharp, in comparison, for example, to the pattern shown in FIG. 4 formed from a conventional reticle mask, described above.

After exposure, regions of the photosensitive material that have not been exposed to light are removed, and the conductive traces that will formed the bit lines are deposited, in well-known manner. In general, it is preferred that the photoresist be a negative resist material.

Figure 7:
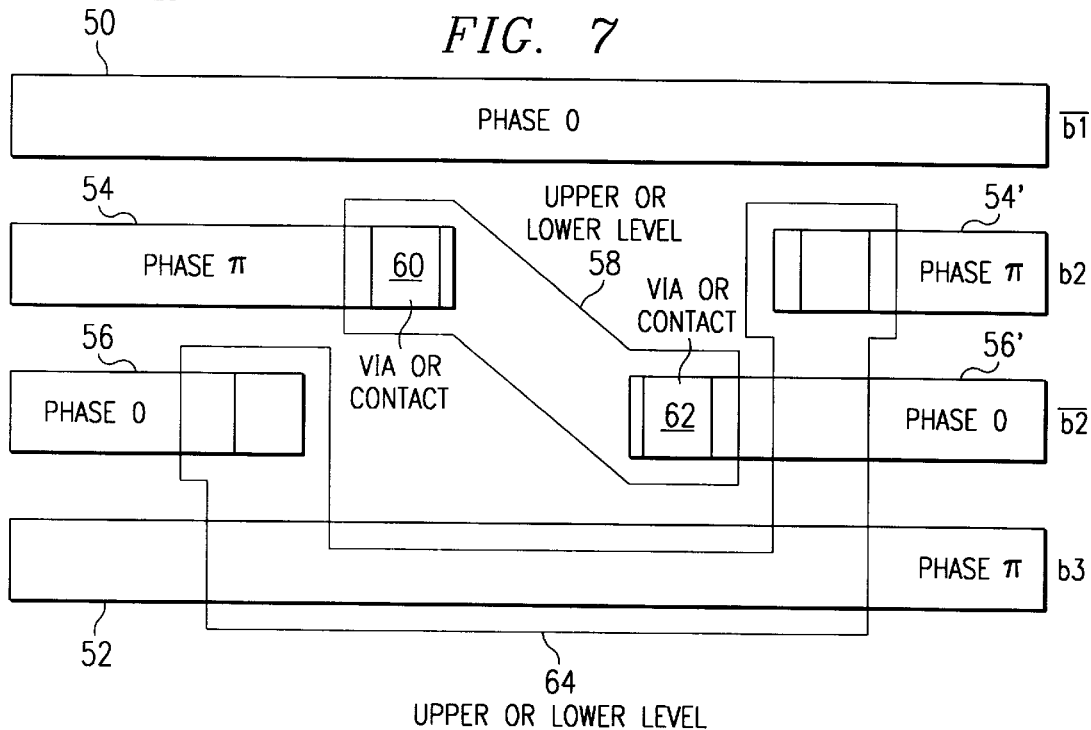
FIG. 7 is a diagram showing a bit line layout in which lines of different phases are interconnected, in accordance with a preferred embodiment of the invention.

An example of a bit line twist structure and method are illustrated in FIG. 7, in which bit lines b1 50 and b3 52 are straight in the areas adjacent the region at which bit lines b2 54 and b2 56 are twisted. With respect to the twist of bit lines b2 54 and b2 56, an interconnect "jumper" 58 is formed to connect the "phase π" segment 54 of bit line b2 to the "phase 0" segment 56' of bit line b2. The interconnect 58 can be formed at an upper or lower level separated from the level at which the bit line traces 50—56 are located and connected to the bit line segments 54' and 56 through the vias 60 and 62. On the other hand, a bit line interconnect segment 64 is provided to interconnect the "phase zero" segment 56 of the bit line b2 to the "phase π" and bit line segment 54' of the bit line b2. The interconnect segment 64 is routed on a separate level insulated from the layer in which the bit line traces are formed to pass at least partially along its length in parallel with the untwisted bit line b3. Thus, the bit line twist layout meets the criteria set forth above for the Levenson phase shift layout rules.

Another preferred embodiment of the invention is illustrated in FIG. 8 in which the untwisted bit lines 90 and 92 respectively of bit line b1 and b3 are untwisted and bit lines b2 94 and b2 96 are twisted. Twist interconnect 100 is provided to connect the Aphase π@ segment 94 of the bit line b2 to the "phase 0" segment of bit line b2. The segment 100 may be located, for example, at an upper level above an insulating layer above the layer contained the bit line traces 90—96, and connected to the respective bit line segments through vias 104 and 105.

Figure 9:
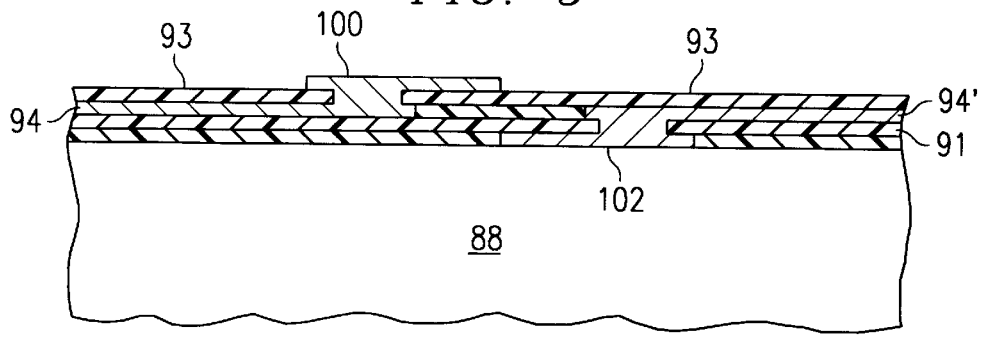
FIG. 9 is a cross-sectional view of the bit line layout of FIG. 8, taken at 9.

On the other hand, the twist interconnect 102 contacts the "phase 0" segment 96 of bit line b2 to the "phase π" segment 94' of bit line b2. The twist interconnect 102 is preferably formed at an opposite level, for example, a lower-level, in the integrated circuit structure containing the bit line pattern from that at which bit line segment 100 is contained, as shown in FIG. 9. The bit line twist segment 102 is connected to the bit line trace segments through vias 108 and 110.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for constructing a twisted bit line structure in an integrated memory circuit, comprising:

forming parallel and adjacent first and second bit line traces in a first conductive level over a substrate by passing light through a phase shift reticle to selectively expose a photosensitive layer deposited over said substrate, wherein said first and second bit line traces comprise a discontinuity at approximately the same location along the length of each of the respective first and second bit line traces to separate each trace into at least two bit line segments;

forming in a second conductive level over said substrate a first connection between a first segment of said first bit line trace and a first segment of said second bit line trace;

and forming in said second conductive level a second connection between a second segment of said first bit line trace and a second segment of said second bit line trace.

2. The method of claim 1 wherein said second conductive level is above said first conductive level.

3. The method of claim 1 wherein said steps of forming said first and second connections comprise forming vias in respective insulating layers above and below said bit line traces and forming conducting interconnections extending at least partially into said vias to contact said bit line segments.

4. The method of claim 1 wherein said step of forming parallel and adjacent first and second bit line traces in a first conductive level over a substrate by passing light through a phase shift reticle to selectively expose a photosensitive layer deposited over said substrate comprises using a Levenson reticle to form said bit line traces.

5. A method for constructing a twisted bit line structure in an integrated memory circuit, comprising:

forming parallel and adjacent first and second bit line traces in a first conductive level over a substrate by passing light through a phase shift reticle to selectively expose a photosensitive layer deposited over said substrate, wherein said first and second bit line traces comprise a discontinuity at approximately the same location along the length of each of the respective first and second bit line traces to separate each trace into at least two bit line segments;

forming in a second conductive level over a substrate a first connection between a first segment of said first bit line trace and a first segment of said second bit line trace;

and forming in a third conductive level over a substrate a second connection between a second segment of said second bit line trace and a second segment of said second bit line trace.

6. The method of claim 5 wherein one of said second or third conductive levels is below said first conductive level and the other of said second or third conductive levels is above said first conductive level.

7. The method of claim 5 wherein said steps of forming said first and second connections comprise forming vias in insulating layers above and below said bit line traces and forming conducting interconnections extending at least partially into said vias to contact said bit line segments.

8. The method of claim 5 wherein said step of forming parallel and adjacent first and second bit line traces in a first conductive level over a substrate by passing light through a phase shift reticle to selectively expose a photosensitive layer deposited over said substrate comprises using a Levenson reticle to form said bit line traces.

9. A twisted bit line structure for an integrated memory circuit, comprising:
    a plurality of bit line traces arranged in a plane parallel to a surface of a semiconductor substrate, said plurality including a pair of adjacent traces each of which is discontinuous at approximately the same location along the length of each of the traces to separate each trace into at least two bit line segments; and
    an insulator layer adjacent said bit line traces and having a surface adjacent said bit line traces and a surface opposite said bit line traces;
    a first connection between a first segment of a first trace of said pair and a first segment of said second trace of said pair, and a second connection between a second segment of said first trace of said pair and a second segment of said second trace of said pair, wherein said connections comprise vias coupling said bit line segments to first and second jumper traces formed adjacent said opposite surface of said insulator layer.

10. The twisted bit line structure of claim 9 wherein said bit line traces and said jumper traces are metal.

11. The twisted bit line structure of claim 9 wherein said insulator layer is formed over said bit line traces.

12. A twisted bit line structure for an integrated memory circuit, comprising:
    a plurality of bit line traces arranged in a plane parallel to a surface of a semiconductor substrate, said plurality including a pair of adjacent traces each of which is discontinuous at approximately the same location along the length of each of the traces to separate each trace into at least two bit line segments;
    a first insulator layer underlying said bit line traces;
    a second insulator layer overlying said bit line traces;
    a first connection between a first segment of a first trace of said pair and a first segment of said second trace of said pair, wherein said first connection comprises vias coupling said bit line segments to a first jumper trace formed under said first insulator layer; and
    a second connection between a second segment of said first trace of said pair and a second segment of said second trace of said pair, wherein said second connection comprises vias coupling said bit line segments to a second jumper trace formed over said second insulator layer.

13. The twisted bit line structure of claim 12 wherein said bit line traces and said jumper traces are metal.

\* \* \* \* \*